United States Patent
Mallik et al.

(10) Patent No.: US 6,992,891 B2
(45) Date of Patent: Jan. 31, 2006

(54) METAL BALL ATTACHMENT OF HEAT DISSIPATION DEVICES

(75) Inventors: Debendra Mallik, Chandler, AZ (US); Christopher L. Rumer, Chandler, AZ (US); Jeffrey S. Winton, Chandler, AZ (US); Michele J. Berry, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 291 days.

(21) Appl. No.: 10/406,721

(22) Filed: Apr. 2, 2003

(65) Prior Publication Data

US 2004/0196634 A1 Oct. 7, 2004

(51) Int. Cl.
  *H05K 7/20* (2006.01)

(52) U.S. Cl. .................. 361/704; 174/16.3; 165/80.2; 165/80.3; 165/185; 257/707; 257/713; 301/700; 301/719; 301/707

(58) Field of Classification Search ............... 62/259.2; 174/16.3, 35 R; 165/80.2, 180.3, 185; 257/706–707, 257/712–713, 722; 361/704–721, 816, 818
See application file for complete search history.

(56) References Cited

U.S. PATENT DOCUMENTS 6,469,381 B1 * 10/2002 Houle et al. ............... 257/707
6,507,104 B2 * 1/2003 Ho et al. .................... 257/712
6,525,420 B2 * 2/2003 Zuo et al. ................... 257/715

* cited by examiner

*Primary Examiner*—Gregory Thompson
(74) *Attorney, Agent, or Firm*—Robert G. Winkle

(57) ABSTRACT

An assembly including a heat dissipation device having an attachment surface, a substrate having an attachment surface, and a plurality of metal balls extending between the heat dissipation device attachment surface and the substrate attachment surface. The assembly may include at least one microelectronic die disposed between the heat dissipation device attachment surface and the substrate attachment surface.

18 Claims, 7 Drawing Sheets

METAL BALL ATTACHMENT OF HEAT DISSIPATION DEVICES

BACKGROUND OF THE INVENTION

1. Field of the Invention

The present invention relates to apparatus and methods for removal of heat from electronic devices. In particular, the present invention relates to the attachment of heat dissipation devices to microelectronic substrates with metal balls.

2. State of the Art

Higher performance, lower cost, increased miniaturization of integrated circuit components, and greater packaging densities of integrated circuits are ongoing goals of the computer industry. As these goals are achieved, microelectronic dice become smaller. Accordingly, the density of power consumption of the integrated circuit components in the microelectronic die has increased, which, in turn, increases the average junction temperature of the microelectronic die. If the temperature of the microelectronic die becomes too high, the integrated circuits of the microelectronic die may be damaged or destroyed.

Various apparatus and techniques have been used and are presently being used for removing heat from microelectronic dice. One such heat dissipation technique involves the attachment of an integrated heat spreader to a microelectronic die. FIG. 10 illustrates an assembly 200 comprising a microelectronic die 202 (illustrated as a flip chip) physically and electrically attached to a substrate 204 (such as an interposer, a motherboard, or the like) by a plurality of solder balls 206 extending between pads 208 on an active surface 212 of the microelectronic die 202 and lands 214 on the substrate 204. To mechanically and physically reinforce the solder balls 206 connecting the microelectronic die pads 208 and the substrate lands 214, an underfill material 210 is disposed therebetween.

The assembly 200 further includes an integrated heat spreader 216 comprising a conductive plate 218 having at least one stand-off 222. The integrated heat spreader 216 is attached to a surface 224 of the substrate 204 by an adhesive layer 226 (generally a non-conductive polymer) between the substrate surface 224 and the stand-off 222, which provides mechanical strength to the assembly 200. The stand-off 222 is used to clear the height of the microelectronic die 202.

A back surface 232 of the microelectronic die 202 is in thermal contact with a first surface 228 of the integrated heat spreader conductive plate 218. A thermal interface material 234 may be disposed between the microelectronic die back surface 232 and the integrated heat spreader conductive plate first surface 228 to enhance conductive heat transfer therebetween.

The integrated heat spreader 216 is usually constructed from a thermally conductive material, such as copper, copper alloys, aluminum, aluminum alloys, and the like. The heat generated by the microelectronic die 202 is drawn into the integrated heat spreader 216 by conductive heat transfer. It is, of course, understood that additional heat dissipation devices can be attached to a second surface 238 of the integrated heat spreader conductive plate 218. These additional heat dissipation devices may include heat slugs and high surface area (finned) heat sinks, and may further include fans attached thereto, as will be evident to those skilled in the art.

One disadvantage of the assembly 200 is that the fabrication of the stand-off(s) 222 adds substantially to the cost of the assembly 200. Therefore, it would be advantageous to develop heat dissipation device designs, which achieve a lower cost and greater ease of manufacturing.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE ILLUSTRATED EMBODIMENT

Figure 1A:
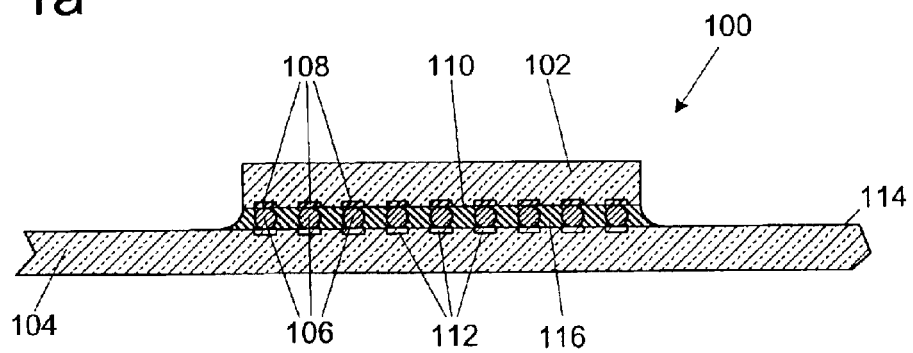
FIGS. 1a–1c are side cross-sectional views of a fabrication technique for an embodiment of a microelectronic die assembly, according to the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1a illustrates a microelectronic die assembly 100 comprising a microelectronic die 102 (illustrated as a flip chip) physically and electrically attached to an attachment surface 114 of a substrate 104 (such as an interposer, a motherboard, or the like) by a plurality of conductive bumps 106, such as solder balls, conductive particle filled polymers, and the like, extending between pads 108 on an active surface 110 of the microelectronic die 102 and lands 112 on the substrate attachment surface 114. To mechanically and physically reinforce the conductive bumps 106 connecting the microelectronic die pads 108 and the substrate lands 112, an underfill material 116, such as an epoxy material, is disposed therebetween. The microelectronic die 102 may include, but is not limited to central processing units (CPUs), chipsets, memory devices, ASICs, and the like.

Figure 1B:
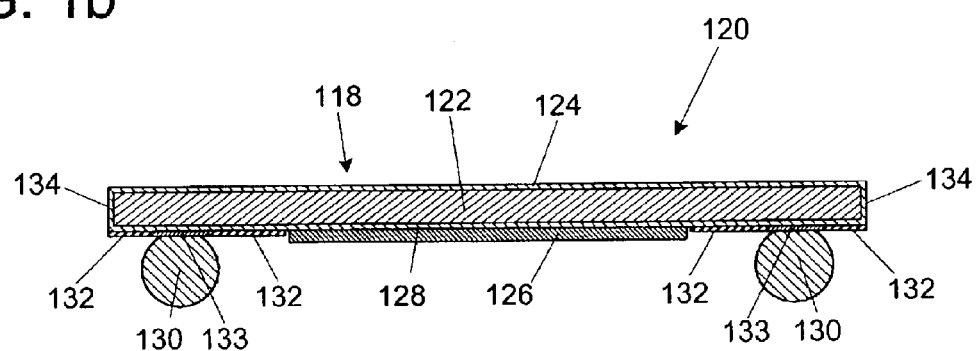

FIG. 1b illustrates a heat dissipation assembly 120 comprising a heat dissipation device 118 including a heat dissipating plate 122 preferably having a plating of finish material 124. It is, of course, understood that when the finish material is not used, the heat dissipation plate 122 may be equivalent to the heat dissipation device 118. A resist material 132, such as epoxy or epoxy-acrylate resin, may be patterned on an attachment surface 128 of the heat dissipation device 118. The resist material 132 may be patterned by any known technique, but preferably a standard lithographic process, as will be understood to those skilled in the art. A plurality of metal balls 130 is disposed proximate the heat dissipation device attachment surface 128 of the heat dissipation device 118, preferably proximate at least one edge 134 of the heat dissipation device 118. Additionally, wetting layers 133, such gold or the like (as known in the art), may be formed prior to the attachment of metal balls 130 to assist in attachment thereof. The resist material 132 contains the plurality of metal balls 130 and/or the wetting layers 133 during formation or during a subsequent attachment process.

The heat dissipating plate 122 may be constructed from a thermally conductive material, such as copper (preferred), copper alloys, aluminum, aluminum alloys, anisotopic materials (such as carbon fiber), and the like. The heat dissipation device 118 is preferably a flat plate having a substantially planar attachment surface 128. Using a flat plate greatly simplifies the fabrication of the heat dissipation device 118, as compared to complex shapes used in the industry. It also allows for easily varying the thickness of the heat dissipation device 118 without significant cost implications. Varying the thickness of the heat dissipation device 118 allows the management of thermal performance, weight, and overall package thickness depending on application However, it is understood that the heat dissipation device 122 is not limited to a flat plate. The heat dissipation device 122 may be of any appropriate shape and may include a heat pipe, thermoelectric coolers, and cold plates (refrigeration or liquid cooled).

The finish material 124 may include, but is not limited to, nickel, gold, cadmium, aluminum, zinc, silver, tin, copper, platinum, chromium, titanium, and alloys thereof. The finish material 124 may also be a mutual layered structure such as nickel plated with gold (preferred). The material for the plurality of metal balls 130, may include, but is not limited to, lead, tin, indium, gallium, bismuth, cadmium, zinc, copper, gold, silver, antimony, germanium, and alloys thereof. Preferred materials for lead-free applications include indium, eutectic tin-silver alloy, or copper. A preferred material for other applications may be a eutectic tin-lead alloy.

A thermal interface material 126 may be disposed on the heat dissipation device attachment surface 128, preferably in a central portion of the heat dissipation device attachment surface 128. The thermal interface material 126 should have high thermal conductivity and may include, but is not limited to, thermal grease, phase-change material, metal filled polymer matrix, solder (alloys of lead, tin, indium, silver, copper, and the like), and other such materials known in the art.

Figure 3A:
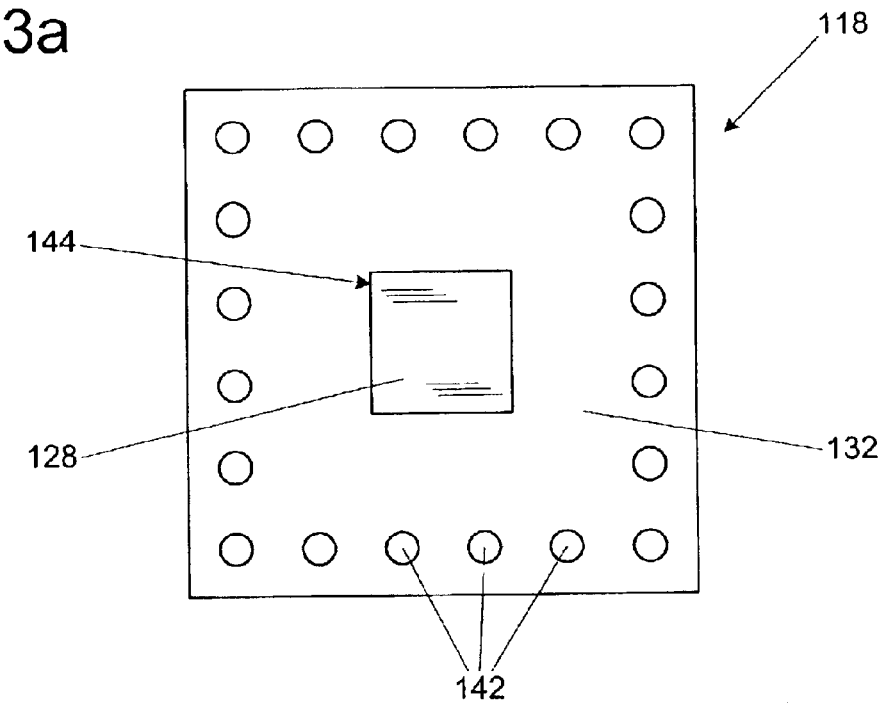
FIG. 3a is a plane view of a thermally conductive plate along line 3—3 of FIG. 2c, according to the present invention.
Figure 3B:
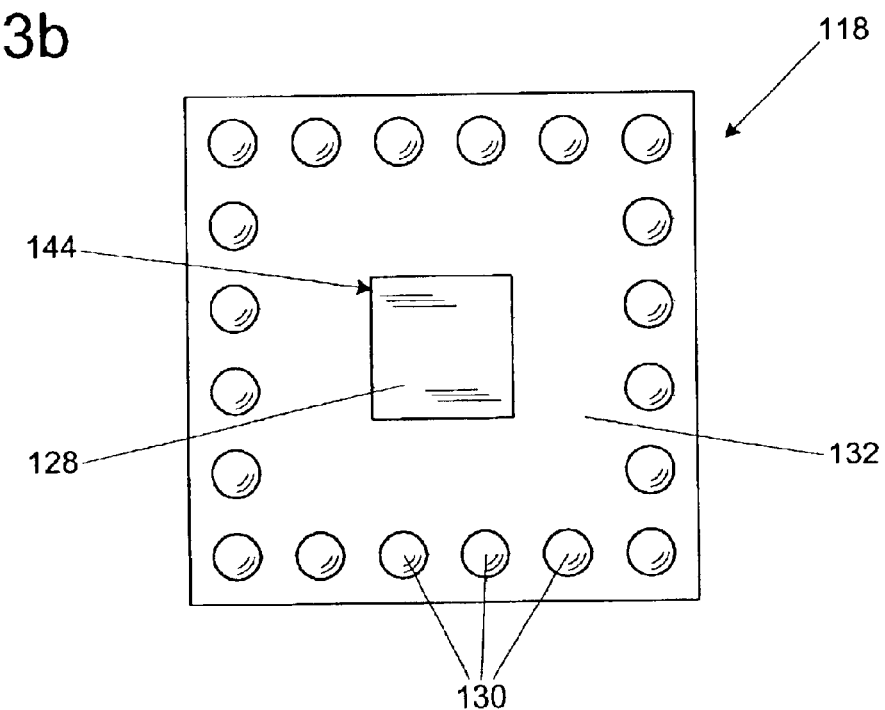
FIG. 3b is a plane view of a thermally conductive plate of FIG. 3a having a plural metal balls disposed thereon, along line 3—3 of FIG. 2c, according to the present invention.

FIG. 3a shows a view of the heat dissipation device 118 looking toward the heat dissipation device attachment surface 128, wherein the resist material 132 is disposed thereon. The resist material 132 is preferably patterned with a plurality of openings 142 in the location of metal ball placement and an opening 144 in a center portion of the heat dissipation device attachment surface 128 in a location of thermal interface material placement. As shown in FIG. 3b, the plurality of metal balls 130 are disposed on the heat dissipation device attachment surface 128. The metal balls 130 are preferably formed on the heat dissipation device attachment surface 128 patterning a metal paste in the plurality of placement openings 142 and then reflowing the metal paste with heat to form the metal balls 130.

Figure 1C:
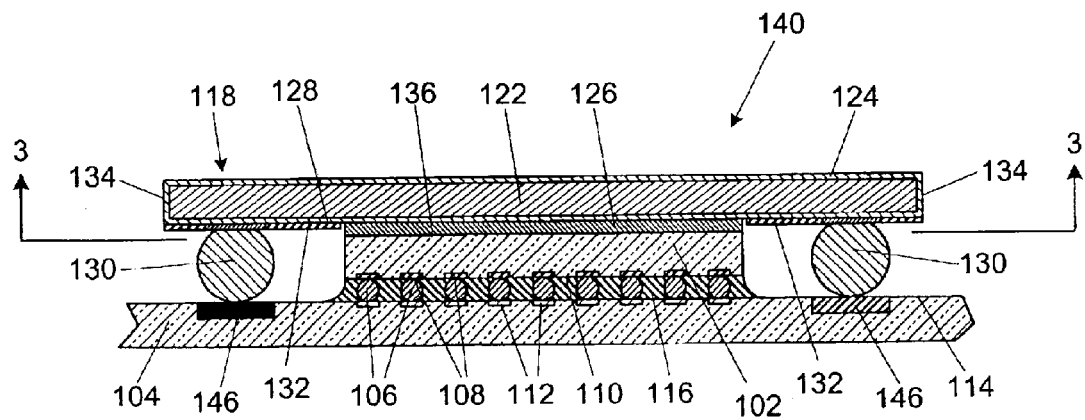

Referring back to FIGS. 1a–1c, FIG. 1c illustrates the heat dissipation assembly 120 of FIG. 1b attached to the microelectronic die assembly 100 of FIG. 1a to form a microelectronic device assembly 140. The thermal interface material 126 is placed in contact with a back surface 136 of the microelectronic die 102 and, substantially simultaneously, the plurality of metal balls 130 is brought into contact with the substrate attachment surface 114, preferably into contact with lands 146, preferably a metal, on the substrate attachment surface 114. The lands 146 may comprise a reflowable material. The assembly is heated to reflow the plurality of metal balls 130 and/or the wetting layers 133 and/or lands 146, thereby adhering the metal balls 130 to the substrate attachment surface 114, as well as the heat dissipation device attachment surface 128. It is, of course, understood that the term "ball" does not limit the term "metal balls" to being perfect spheres, as it is understood that the reflow step can deform the shape of the resulting metal balls.

Using such a reflowable metal material allows the heat dissipation device 118 to self-align along a hortizontal plane and the vertical "pull-in" force created during the reflow process can eliminate the need for clamping during attachment. It is understood that if electrical contact is made between the substrate 104 and the heat dissipation device 118 with the metal balls 130, electromagnetic interference can be controlled (i.e., an electromagnetic interference dampener), as the assembly creates a Faraday cage. It is further understood that the size of the metal ball 130 is selected to create sufficient height to clear the microelectronic die 102.

Figure 2A:
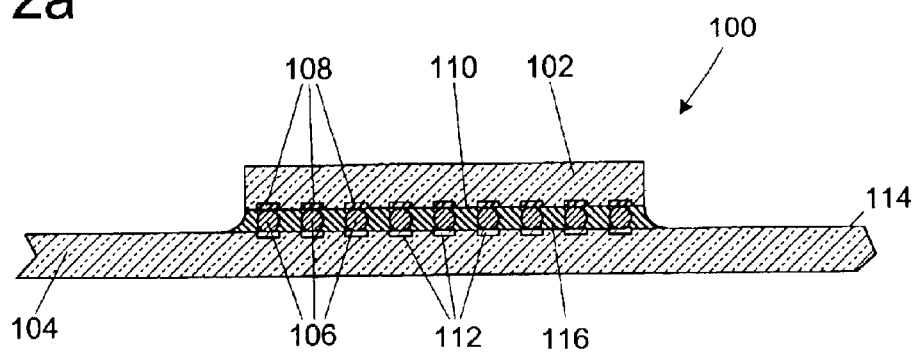
FIGS. 2a–2c are side cross-sectional views of an alternate fabrication technique for an embodiment of a microelectronic die assembly, according to the present invention.
Figure 2B:
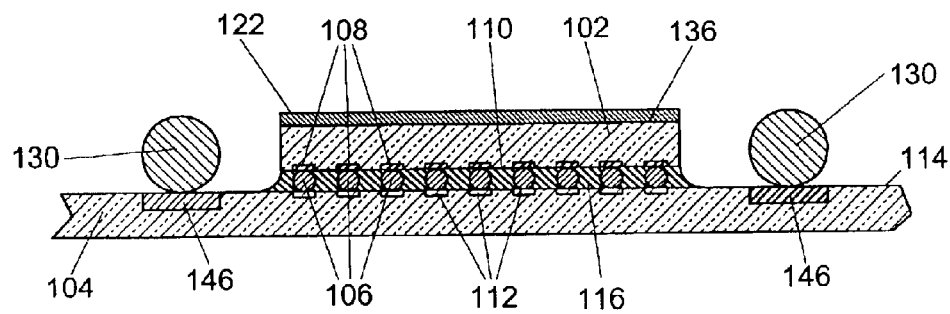
Figure 2C:
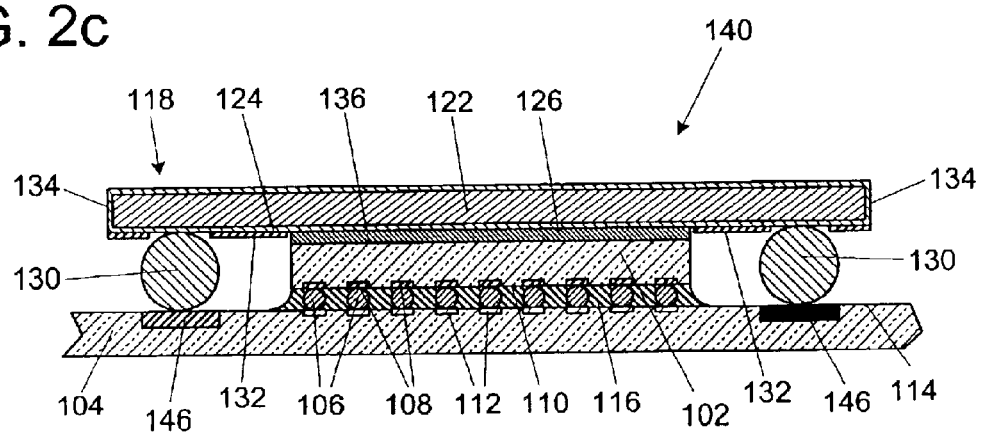

It is, of course, understood that the present invention can be used in a number of microelectronic device assemblies. For example, as shown in FIG. 2a, a microelectronic die assembly 100 similar to that shown in FIG. 1a is provided. As shown in FIG. 2b, the thermal interface material 126 is applied to the microelectronic die back surface 136. The plurality of metal balls 130 is disposed on the substrate attachment surface 114, preferably on their respective metal lands 146. As shown in FIG. 2c, the heat dissipation device 118 is brought into contact with the thermal interface material 126, and, substantially simultaneously, into contact with the plurality of metal balls 130. The assembly is heated to reflow the plurality of metal balls 130, thereby adhering the metal balls 130 to the heat dissipation device attachment surface 128, as well as the substrate attachment surface 114.

Figure 4:
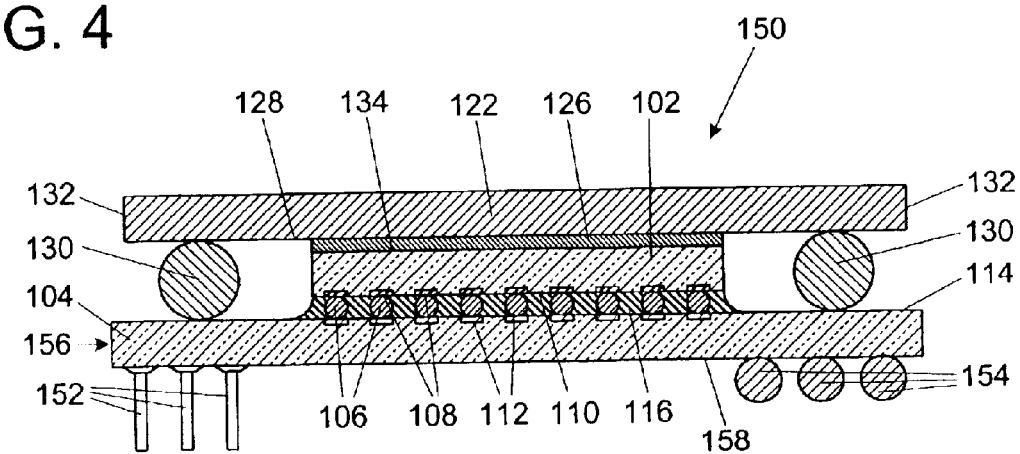
FIGS. 4–9 are side cross-sectional views of a various embodiments of microelectronic die assemblies, according to the present invention.
Figure 5:
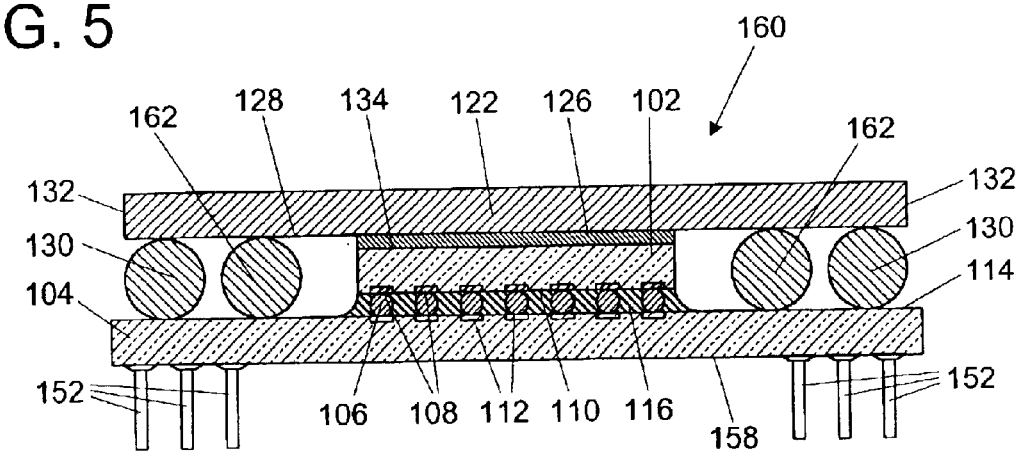

It is, of course, understood that the substrate 104 can be an interposer 156 having a plurality of external contacts, such as pins 152 or solder balls 154 on an external contact surface 158, which connect to an external component (not shown) to form a microelectronic device package 150, as shown in FIG. 4. Further, it is also understood multiple rows of metal balls (illustrated by additional metal balls 162 in FIG. 5) can be utilized to improve the structural integrity of the microelectronic device package 160

Figure 6:
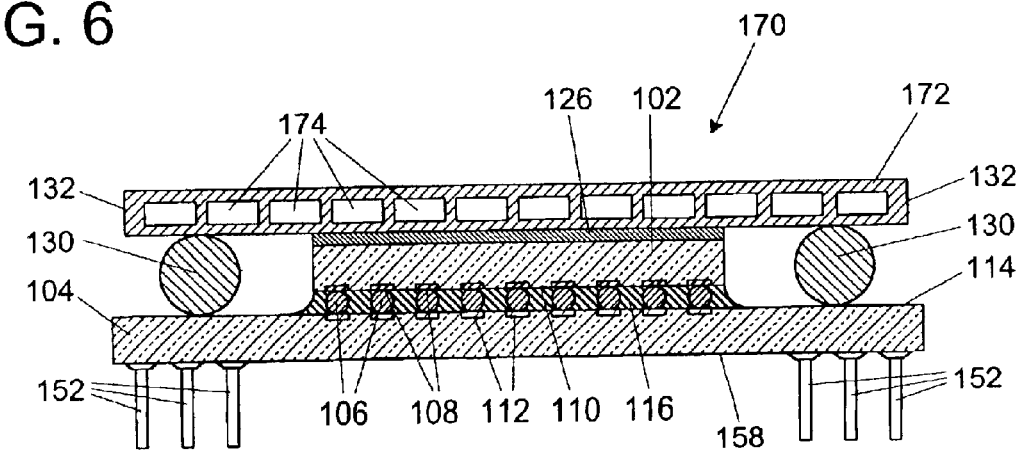
Figure 7:
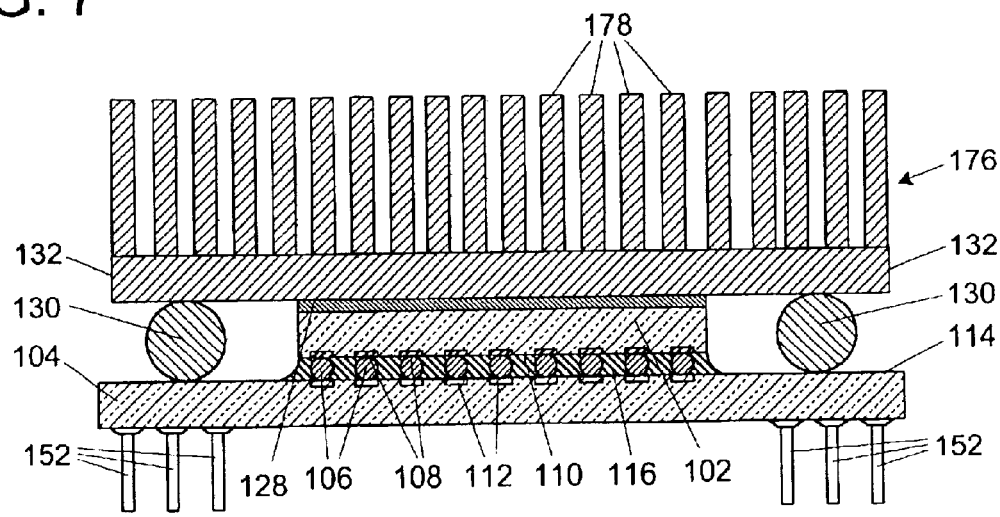

It is understood that a variety of heat dissipation device can be utilized. As shown in FIG. 6, the heat dissipation device may be a heat pipe 172, preferably having a plurality of vapor chambers 174, as will be understood by those skilled in the art, to form microelectronic device package 170. Additionally, the heat dissipation device may be a high surface area heat dissipation device 176 having a plurality of thermally conductive projections 178, such as fins or pillars, as shown in FIG. 7.

Figure 8:
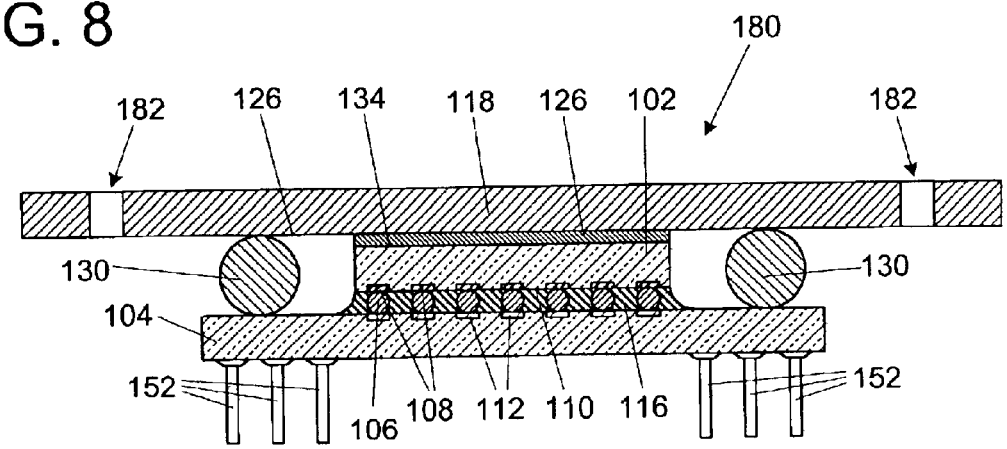

The heat dissipation device may also be adapted for various purposes. For example, in FIG. 8, a heat dissipation device 180 may extend beyond the substrate 104 and have at least one via 182 therethrough, which can be used to attach the heat dissipation device 118 to an external device, such as a socket, a motherboard, or the like (not shown), to form microelectronic device package 180.

Figure 9:
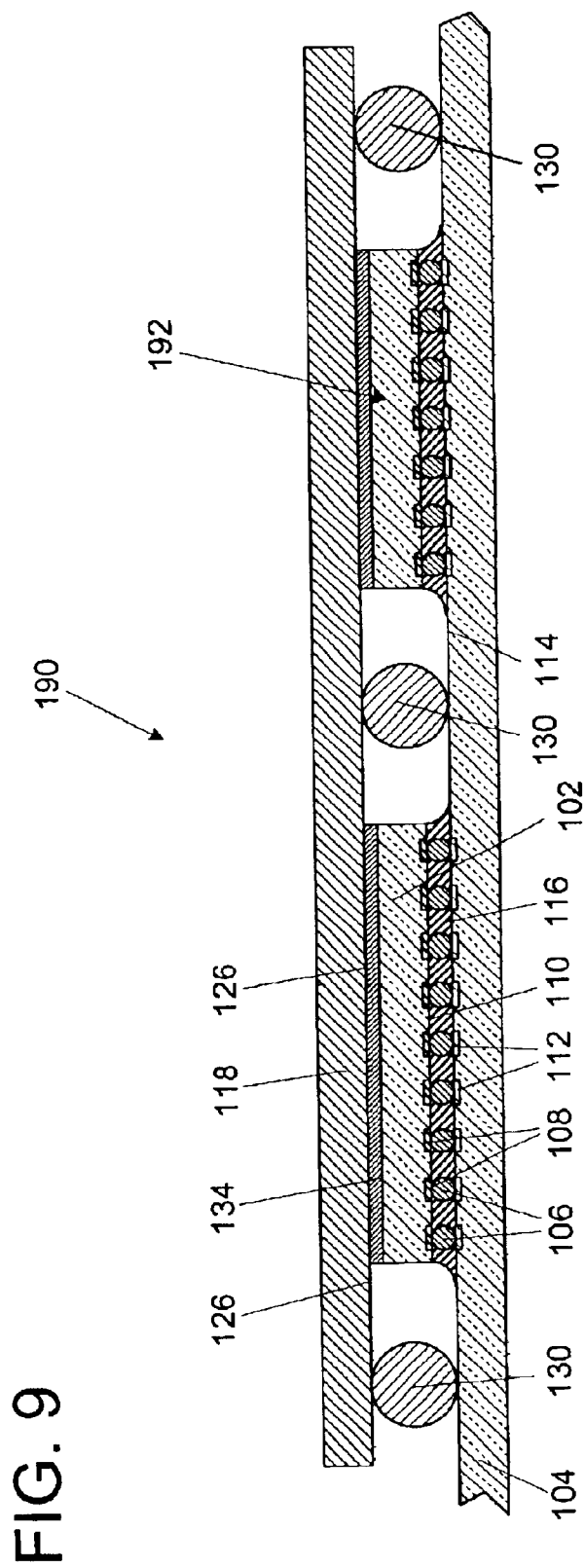
Figure 10:
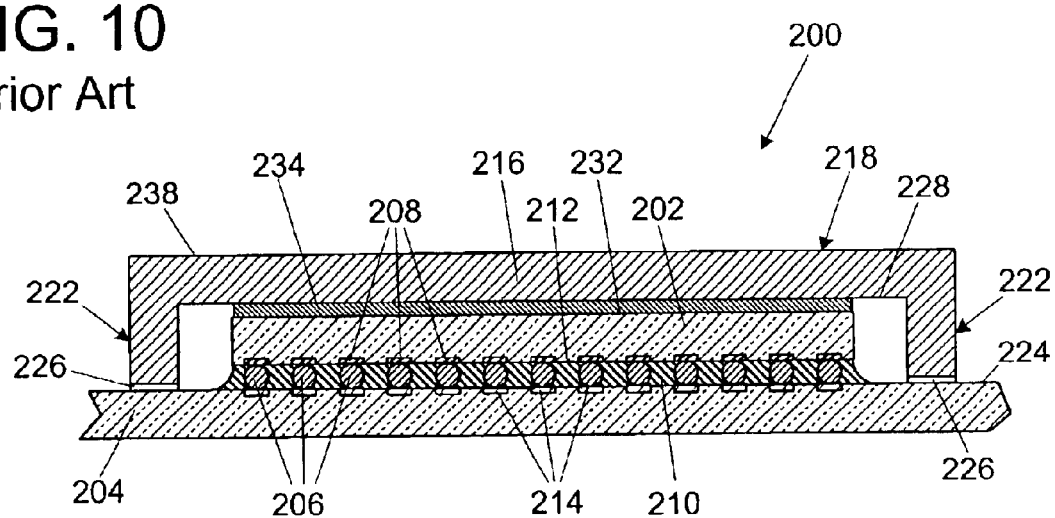
FIG. 10 is a side cross-sectional view of a heat dissipation device attached to a microelectronic die, as known in the art.

The present invention may also be used in multichip modules 190, as shown in FIG. 9. Multiple microelectronic dice (illustrated as microelectronic die 102 and second microelectronic die 192) may be disposed between the heat dissipation device 118 and the substrate 104. A plurality of metal balls 130 may be disposed between the microelectronic dice, as well as in other desired locations to improve structural integrity of the multichip module 190. Naturally, metal ball placement can be optimized to make room for other active or passive components on the substrate 104 which providing required structural strength to the component.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A multichip module, comprising:
   a heat dissipation device having an attachment surface;
   a substrate having an attachment surface;
   a plurality of microelectronic dice disposed between said heat dissipation device attachment surface and said substrate attachment surface;
   a plurality of metal balls extending between said heat dissipation device attachment surface and said substrate attachment surface, wherein at least one of said plurality of metal balls is positioned between at least two of said plurality of microelectronic dice.

2. The multichip module of claim 1, further comprising a thermal interface material disposed between said heat dissipation device attachment surface and a back surface of at least one of said plurality of microelectronic dice.

3. The multichip module of claim 1, further comprising an active surface of said at least one microelectronic die in electrical contact with said substrate attachment surface.

4. The multichip module of claim 1, wherein at least one of said plurality of metal balls contacts at least one wetting layer on said heat dissipation device active surface.

5. The multichip module of claim 1, wherein at least one of said plurality of metal balls contacts at least one land on said substrate attachment surface.

6. The multichip module of claim 1, wherein said plurality of metal balls comprise lead, tin, indium, gallium, bismuth, cadmium, zinc, copper, gold, silver, antimony, germanium, and alloys thereof.

7. The multichip module of claim 1, further comprising a plurality of external contacts disposed on an external contact surface of said substrate.

8. The multichip module of claim 1, wherein said heat dissipation device comprises a heat pipe.

9. The multichip module of claim 1, wherein said heat dissipation device further comprises a plurality of thermally conductive projections extending therefrom.

10. A method for fabricating a microelectronic device assembly, comprising:
    providing a heat dissipation device baying an attachment surface;
    providing a substrate having an attachment surface;
    disposing a plurality of microelectronic dice between said heat dissipation device attachment surface and said substrate attachment surface; and
    disposing a plurality of metal balls between said heat dissipation device attachment surface and said substrate attachment surface, wherein at least one of said plurality of metal balls is positioned between at least two of said plurality of microelectronic dice.

11. The method of clam 10, further comprising disposing a thermal interface material between said heal dissipation device attachment surface and a back surface of at least one said plurality of microelectronic dice.

12. The method of claim 10, further comprising forming an electrical contact between an active surface of said at least one of said plurality of microelectronic die dice in electrical and said substrate attachment surface.

13. The method of claim 10, further comprising contacting at least one of said plurality of metal balls with at least one wetting layer on said heat dissipation device active surface.

14. The method of claim 10, further comprising contacting at least one of said plurality of metal balls with at least one land on said substrate attachment surface.

15. The method of claim 10, wherein disposing a plurality of metal balls between said heat dissipation device attachment surface and said substrate attachment surface comprises disposing a plurality of metal bells comprising lead, tin, indium, gallium, bismuth, cadmium, zinc, copper, gold, silver, antimony, germanium, and alloys thereof.

16. The method of claim 10, further comprising disposing a plurality of external contacts on an external contact surface of said substrate.

17. The method of claim 10, wherein providing a heat dissipation device comprises providing a beat pipe.

18. The method of claim 10, wherein providing a beat dissipation device comprises providing said heat dissipation device having a plurality of thermally conductive projections extending therefrom.

* * * * *

UNITED STATES PATENT AND TRADEMARK OFFICE
CERTIFICATE OF CORRECTION

PATENT NO. : 6,992,891 B2  Page 1 of 1
DATED : January 31, 2006
INVENTOR(S) : Agrawal It is certified that error appears in the above-identified patent and that said Letters Patent is hereby corrected as shown below:

<u>Column 6,</u>
Line 16, delete "baying" and insert -- having --.
Line 28, delete "heal" and insert  heat --.
Line 30, after "one" insert -- of --.
Line 33, delete "die".
Lines 52 and 53, delete "beat" and insert -- heat --.

Signed and Sealed this

Second Day of May, 2006

JON W. DUDAS
*Director of the United States Patent and Trademark Office*